United States Patent
Quevy et al.

(10) Patent No.: US 8,629,739 B2
(45) Date of Patent: Jan. 14, 2014

(54) OUT-OF PLANE MEMS RESONATOR WITH STATIC OUT-OF-PLANE DEFLECTION

(75) Inventors: Emmanuel P. Quevy, El Cerrito, CA (US); David H. Bernstein, San Francisco, CA (US); Mehrnaz Motiee, Fremont, CA (US)

(73) Assignee: Silicon Laboratories Inc., Austin, TX (US)

( * ) Notice: Subject to any disclaimer, the term of this patent is extended or adjusted under 35 U.S.C. 154(b) by 0 days.

(21) Appl. No.: 13/599,240

(22) Filed: Aug. 30, 2012

(65) Prior Publication Data
US 2012/0329255 A1 Dec. 27, 2012

Related U.S. Application Data

(60) Division of application No. 13/173,432, filed on Jun. 30, 2011, now Pat. No. 8,258,893, which is a continuation of application No. 12/182,082, filed on Jul. 29, 2008, now Pat. No. 7,999,635.

(51) Int. Cl.
*H03H 9/24* (2006.01)
*H03H 3/007* (2006.01)
*H01L 21/00* (2006.01)

(52) U.S. Cl.
USPC .............. 333/186; 333/200; 438/52; 438/487

(58) Field of Classification Search
USPC ............ 333/186, 197, 200; 310/309; 438/50, 438/52, 53, 55, 386, 486, 487
See application file for complete search history.

(56) References Cited

U.S. PATENT DOCUMENTS

| | | | |
|---|---|---|---|
| 3,735,971 A * | 5/1973 | Steinemann | 267/182 |
| 5,640,133 A | 6/1997 | MacDonald et al. | |
| 5,729,075 A | 3/1998 | Strain | |
| 6,073,484 A | 6/2000 | Miller et al. | |
| 6,489,864 B2 | 12/2002 | Frey et al. | |
| 6,497,141 B1 | 12/2002 | Turner et al. | |
| 6,557,419 B1 | 5/2003 | Herb et al. | |
| 6,567,715 B1 * | 5/2003 | Sinclair et al. | 700/110 |
| 6,650,204 B2 * | 11/2003 | Ma et al. | 333/188 |
| 6,679,995 B1 * | 1/2004 | Banjac et al. | 216/2 |
| 6,710,680 B2 | 3/2004 | Niu et al. | |
| 6,739,190 B2 | 5/2004 | Hsu et al. | |

(Continued)

FOREIGN PATENT DOCUMENTS

WO WO 2006/013741 A2 2/2006
WO WO 2008/019179 A2 2/2008

OTHER PUBLICATIONS

J. Teva et al.; "VHF CMOS-MEMS Resonator Monolithically Integrated in a Standard 0.35 micrometer CMOS Technology"; IEEE MEMS 2007, Kobe, Japan Jan. 21-25, 2007, pp. 779-782.*
S. Matsuda et al.; "Correspondence: Correlation Between Temperature Coefficient of Elasticity and Fourier Transform Infrared Spectra of Silicon Dioxide Films for Surface Acoustic Wave Devices"; IEEE Transactions on Ultrasonics, Ferroelectrics, and Frequency Control, vol. 58, No. 8, Aug. 2011, pp. 1684-1687.*
Definition of "about" preposition, The Free Merriam-Webster Dictionary, www.merriam-webster.com/dictionary/about, downloaded May 22, 2013, one page.*

(Continued)

*Primary Examiner* — Barbara Summons
(74) *Attorney, Agent, or Firm* — Abel Law Group, LLP

(57) ABSTRACT

A method of forming a microelectromechanical systems (MEMS) device includes forming an electrode on a substrate. The method includes forming a structural layer on the substrate. The structural layer is disposed about a perimeter of the electrode and has a residual film stress gradient. The method includes releasing the structural layer to form a resonator coupled to the substrate. The residual film stress gradient deflects a first portion of the resonator out of a plane defined by a surface of the electrode.

20 Claims, 13 Drawing Sheets

(56) References Cited

U.S. PATENT DOCUMENTS

| | | | |
|---|---|---|---|
| 6,744,174 B2 | 6/2004 | Paden et al. | |
| 6,831,531 B1 | 12/2004 | Giousouf et al. | |
| 6,844,214 B1 | 1/2005 | Mei et al. | |
| 6,909,221 B2 | 6/2005 | Ayazi et al. | |
| 6,922,118 B2 * | 7/2005 | Kubena et al. | 333/188 |
| 6,987,432 B2 | 1/2006 | Lutz et al. | |
| 6,988,789 B2 | 1/2006 | Silverbrook | |
| 7,008,812 B1 | 3/2006 | Carley | |
| 7,071,793 B2 | 7/2006 | Lutz et al. | |
| 7,079,299 B1 | 7/2006 | Conant et al. | |
| 7,202,761 B2 | 4/2007 | Lutz et al. | |
| 7,221,241 B2 * | 5/2007 | Lutz et al. | 333/186 |
| 7,265,019 B2 * | 9/2007 | Chinthakindi et al. | 438/381 |
| 7,420,439 B2 | 9/2008 | Morita et al. | |
| 7,468,324 B2 * | 12/2008 | Cheung et al. | 438/706 |
| 7,514,760 B1 * | 4/2009 | Quevy | 257/416 |
| 7,581,443 B2 | 9/2009 | Kubena et al. | |
| 7,595,708 B2 | 9/2009 | Lutz et al. | |
| 7,639,104 B1 | 12/2009 | Quevy et al. | |
| 7,816,166 B1 * | 10/2010 | Quevy | 438/52 |
| 7,836,574 B2 * | 11/2010 | Jafri et al. | 29/594 |
| 7,858,422 B1 * | 12/2010 | Quevy et al. | 438/52 |
| 7,999,635 B1 | 8/2011 | Quevy et al. | |
| 2002/0151100 A1 | 10/2002 | Coffa et al. | |
| 2005/0250236 A1 | 11/2005 | Takeuchi et al. | |
| 2006/0017533 A1 | 1/2006 | Jahnes et al. | |
| 2006/0033594 A1 | 2/2006 | Lutz et al. | |
| 2006/0186971 A1 | 8/2006 | Lutz et al. | |
| 2006/0261703 A1 * | 11/2006 | Quevy et al. | 310/315 |
| 2007/0013268 A1 | 1/2007 | Kubo et al. | |
| 2009/0219104 A1 * | 9/2009 | Van Beek et al. | 331/154 |
| 2009/0224850 A1 | 9/2009 | Nakamura et al. | |
| 2009/0322448 A1 | 12/2009 | Bhave et al. | |
| 2010/0093125 A1 | 4/2010 | Quevy et al. | |
| 2011/0084781 A1 | 4/2011 | Quevy et al. | |
| 2011/0090554 A1 | 4/2011 | Tung | |

OTHER PUBLICATIONS

Choo, H. et al., "A Simple Process to Fabricate Self-Aligned, High-Performance Torsional Microscanners; Demonstrated Use in a Two-Dimensional Scanner," 2005 IEEE/LEOS International Conference on Optical MEMS and Their Applications; Aug. 1-4, 2005, pp. 21-22.

Chiou, J.C. et al., "Out-of-Plane CMOS-MEMS Resonator with Electrostatic Driving and Piezoresistive Sensing," 2006 IEEE-NANO Sixth IEEE Conference on Nanotechnology, Jun. 17-20, 2006, vol. 2, pp. 929-932.

Helmbrecht, Michael A., et al., "Performance of high-stroke, segmented MEMS deformable-mirror technology," MEMS/MOEMS Components and Their Applications III, Proc. of SPIE, vol. 6113, 61130L, (Jan. 2006), pp. 1-10.

Jianqiang, Han, et al., "Dependence of the resonance frequency of thermally excited microcantilever resonators on temperature," Elsevier, Sensors and Actuators, A 101 (Apr. 2002), pp. 37-41.

Schmidt, Martin A., et al., "Design and Calibration of a Microfabricated Floating-Element Shear-Stress Sensor," IEEE Transactions on Electron Devices, vol. 35, No. 6, (Jun. 1988), pp. 750-757.

Shen, F., et al., "Thermal Effects on Coated Resonant Microcantilevers," Elsevier, Sensors and Actuators, A 95, (Aug. 2001), pp. 17-23.

Tang, William C., et al., "Electrostatic Comb Drive Levitation and Control Method," Journal of Microelectromechanical Systems, vol. 1, No. 4 (Dec. 1992), pp. 170-178.

Tang, William C., et al., "Laterally Driven Polysilicon Resonant Microstructures," MEMS 1989, Proceedings, An Investigation of Micro Structures, Sensors, Actuators, Machines and Robots, IEEE (Feb. 1989), pp. 53-59.

Tung, Meng Fai, "An Introduction to MEMS Optical Switches," (Dec. 13, 2001), pp. 1-37.

* cited by examiner

OUT-OF PLANE MEMS RESONATOR WITH STATIC OUT-OF-PLANE DEFLECTION

CROSS-REFERENCE TO RELATED APPLICATION(S)

This application is a divisional of U.S. patent application Ser. No. 13/173,432, filed Jun. 30, 2011 (U.S. Pat. No. 8,258,893), entitled "Out-of-Plane MEMS Resonator with Static Out-of-Plane Deflection," which application is a continuation of U.S. patent application Ser. No. 12/182,082, filed Jul. 29, 2008 (U.S. Pat. No. 7,999,635), entitled "Out-of-Plane MEMS Resonator with Static Out-of-Plane Deflection," naming inventors Emmanuel P. Quevy et al., which applications are hereby incorporated by reference.

TECHNICAL FIELD

Embodiments of the invention pertain to the field of Microelectromechanical Systems (MEMS) and more particularly to MEMS resonators.

BACKGROUND

"MEMS" generally refers to an apparatus incorporating some mechanical structure having a dimensional scale that is comparable to microelectronic devices, for example, less than approximately 250 um. This mechanical structure is typically capable of some form of mechanical motion and is formed at the micro-scale using fabrication techniques similar to those utilized in the microelectronic industry, such as thin film deposition, and thin film patterning by photolithography and reactive ion etching (RIE). The micromechanical structure in a MEMS device distinguishes a MEMS device from a microelectronic device.

Certain MEMS devices include a resonator. MEMS resonators are of particular interest in timing devices for an integrated circuit (IC). The resonator may have a variety of physical shapes, such as, but not limited to, beams and plates. FIG. 1 depicts a conventional MEMS device 100 including a resonator 105 coupled to a substrate 102 via an anchor 104. During operation resonator 105 is electrostatically driven by a first electrode 110 to dynamically deflect so as to increase its capacitance by decreasing its gap from electrode 110 when a voltage differential exists between the two. Because electrode 110 and resonator 105 are the same height and in the same plane as the structural layer, the resonator 105, when driven, deforms laterally across a distance between electrode 110 and a second electrode 111, remaining in a plane 103 of the electrode 110. The plane 103 is parallel to substrate 102 and therefore defines the layout area or "footprint" of conventional MEMS device 100. Electrode 111 detects the resonant frequency of resonator 105 as the capacitance varies between the two in response to the deflection driven by electrode 110. Because the resonator is driven to resonate in a mode where the resonator 105 remains in the plane 103 of the electrode 110, the conventional MEMS device 100 is commonly referred to as an "in-plane" or "lateral" mode resonator.

There are several drawbacks to the parallel-plate-capacitor drive and sense mechanism of conventional MEMS device 100. The electrostatic force is nonlinear unless the amplitude of vibration is limited to a small fraction of the capacitor gap. The quality factor Q of the resonance may be limited by squeeze-film dampening. Furthermore, because the transduction efficiency of resonator 105 is dependent on the area of the parallel-plate capacitor formed between the resonator 105 and electrode 110, fabrication of the resonator 105 generally includes a number of techniques to ensure the resonator 105, when released, remains perfectly flat and in the plane of the electrode 110. Such fabrication techniques are often thermally taxing or require prohibitively expensive or commercially unfeasible methods.

SUMMARY

In at least one embodiment of the invention, a method of forming a microelectromechanical systems (MEMS) device includes forming an electrode on a substrate. The method includes forming a structural layer on the substrate. The structural layer is disposed about a perimeter of the electrode and has a residual film stress gradient. The method includes releasing the structural layer to form a resonator coupled to the substrate. The residual film stress gradient deflects a first portion of the resonator out of a plane defined by a surface of the electrode. Forming the structural layer may include depositing, over the substrate, a film including a dopant gradient over the film thickness. Forming the structural layer may include depositing, over the substrate, a film stack comprising a plurality of films. A film deposited over the substrate may have an intrinsic residual stress to form a residual film stress gradient over the thickness of the structural element. Forming the structural layer may include at least one of laser recrystallization or metal-induced crystallization to vary the crystallinity over the thickness of the structural element. The method may include frequency trimming the MEMS resonator by selectively modifying the thickness of the structural layer. Selectively modifying the thickness may include at least one of localized polishing of the structural layer prior to releasing the structural layer or focused ion beam etching of the structural layer, either before or after releasing the structural layer.

BRIEF DESCRIPTION OF THE DRAWINGS

The present invention is illustrated by way of example, and not by way of limitation, in the figures of the accompanying drawings and in which.

DETAILED DESCRIPTION

Figure 1:
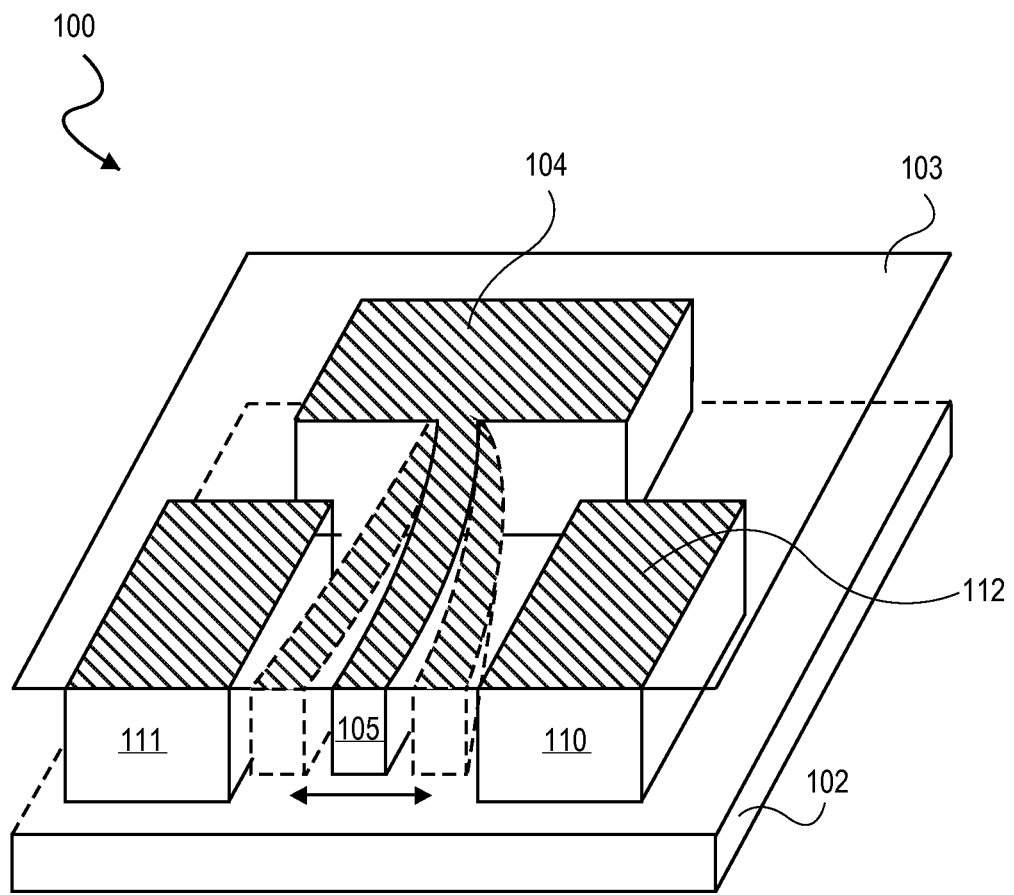
FIG. 1 depicts a conventional MEMS device with in-plane resonator.

In the following description, numerous details are set forth. It will be apparent, however, to one skilled in the art, that the present invention may be practiced without these specific details. In some instances, well-known methods and devices are shown in block diagram form, rather than in detail, to avoid obscuring the present invention. Reference throughout this specification to "an embodiment" means that a particular feature, structure, function, or characteristic described in connection with the embodiment is included in at least one embodiment of the invention. Thus, the appearances of the phrase "in an embodiment" in various places throughout this specification are not necessarily referring to the same embodiment of the invention. Furthermore, the particular features, structures, functions, or characteristics may be combined in any suitable manner in one or more embodiments. For example, a first embodiment may be combined with a second embodiment anywhere the two embodiments are not mutually exclusive.

The terms "over," "under," "between," and "on" as used herein refer to a relative position of one member with respect to other members. As such, for example, one member disposed over or under another member may be directly in contact with the other member or may have one or more intervening members. Moreover, one member disposed between members may be directly in contact with the two members or may have one or more intervening members. In contrast, a first member "on" a second member is in contact with that second member. Additionally, the relative position of one member with respect to other members is provided assuming operations are performed relative to a substrate without consideration of the absolute orientation of the substrate. Furthermore, a "top surface" refers to a surface of a structure or layer which is opposite of or distant from the substrate surface, while "bottom surface" refers to a surface proximate to the substrate surface. References to a "sidewall" therefore refer to surfaces nominally perpendicular to the substrate surface (e.g., vertical when the major surface of the substrate is in a typical horizontal orientation).

In embodiments of the present invention, a resonator is statically deflected, or deformed, "out-of-plane." As used herein, "out-of-plane" deformation means the deformation is in a direction perpendicular to the largest linear dimensions of the resonator. For example, where the largest linear dimensions are in directions across a substrate surface, out-of-plane is in the vertical direction, away from the substrate. The out-of-plane deflection is referred to herein as "static" because it is a result of a residual stress gradient in the structural layer from which the resonator is formed. The residual film stress gradient in the structural layer induces a strain gradient, or deflection, along the length L when the resonator is at rest.

In particular embodiments, use of the strain gradient enables out-of-plane transduction without yield and reliability problems due to stiction (e.g., the sticking of the resonator to the substrate) when the resonator is driven to dynamically deflect out-of-plane. Because a residual stress gradient in the structural layer is embraced rather than eschewed in such designs, processing steps directed at reducing or eliminating the residual stress gradient become unnecessary. In particular embodiments, out-of-plane transduction is utilized to achieve better transduction efficiency as compared to lateral resonator designs of similar linear dimensions (i.e., footprint) resulting in a lower motional resistance. Sensitivity to critical dimensions of the resonator may be reduced relative to lateral resonator designs, and the ability to adjust film thickness is leveraged to tailor the frequency of the out-of-plane mode.

Figure 2:
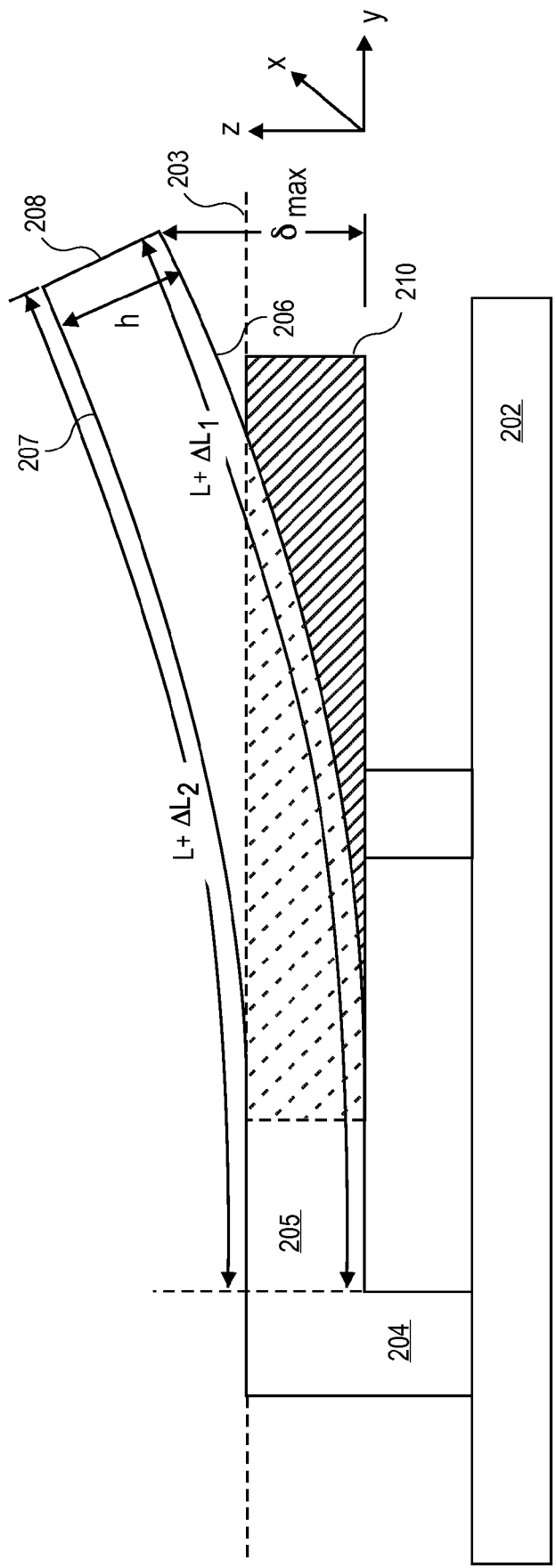
FIG. 2 depicts a side view of a resonator statically deflected out-of-plane, in accordance with an embodiment.

FIG. 2 depicts a side view of an exemplary resonator 205 having a strain gradient so as to be statically deflected out of an electrode plane 203 passing through a portion of an electrode 210 (e.g., top electrode surface). In the embodiment depicted in FIG. 2, the resonator is driven and sensed electrostatically by the adjacent pair of electrodes 210. However, other embodiments do not utilize electrostatic transduction, but instead rely on other transduction means to sustain the resonator's out-of-plane motion. For example, a resonator statically deflected out-of-plane may rely on thermal, piezoelectric, piezoresistive or optical transduction and may include a transducer embedded in the resonator itself. While such transduction methods are known in the art and therefore are not discussed further herein, it should be appreciated that references herein to a plane of an electrode in electrostatic driver embodiments is alternately described for alternate transducers in terms of a plane extending along a major length of the resonator (i.e., largest dimension of resonator) and substantially parallel to an underlying substrate surface from which the resonator statically deflects "out-of" (e.g., "above" or "below").

In the exemplary embodiment depicted in FIG. 2, the resonator 205 is a cantilevered beam coupled to a substrate 202 by an anchor 204. The anchoring of electrode 210 is such that it remains fixed in-plane after the resonator is released and is not substantially deflected by a residual stress gradient that may be present in the electrode material. In the depicted embodiment, electrode 210 is approximately the same thickness or height as the resonator 205.

Electrode plane 203 is substantially parallel with a plane of the major surface of substrate 202 and therefore the out-of-plane deflection of resonator 205 results in a first portion, proximate to a cantilever tip 208, being elevated away from the plane of substrate 202 by a maximum static deflection z while a second portion, proximate to anchor 204, remains within the electrode plane 203. Similarly, because the resonator 205 is deflected out of electrode plane 203, the deflection causes the resonator 205 to move in a direction "away" from the electrode 210. In the depicted embodiment, the resonator 205 has a strain gradient across a thickness h such that at bottom resonator surface 206, proximate to substrate 202, is deformed by a first greater amount to a length $L+\Delta L_1$ and the top resonator surface 207, distant from substrate 202, is deformed by second lesser amount to a length $L+\Delta L_2$, where L is the nominal length of the cantilever beam "as fabricated." In an alternate embodiment, the out-of-plane static deflection is in a direction toward the plane of substrate 202 (e.g., "downward," rather than the "upward" direction in FIG. 2).

The amount of maximum static deflection $\delta_{max}$ may be any non-zero amount. Preferably, the amount of maximum static deflection $\delta_{max}$ is at least 50% of the thickness h and in certain embodiments, the amount of maximum static deflection $\delta_{max}$ is equal to or greater than the thickness h of the resonator. For example, resonator 205 has a rectangular cross-section with width w and thickness h with a Young's modulus of E. The residual film stress is a tensor which has nonzero components in the lateral directions only, that is, $\sigma_{xx}=\sigma_{yy}=\sigma_0$ and the remaining components vanish. In an embodiment where the gradient of $\sigma_0$ in the z direction is $\Gamma$ and the residual stress at the bottom surface 206 (located at z=0) is −200 MPa, $\sigma_0$(x, y, z)=−200−z$\Gamma$ where $\sigma_0$ is in MPa. For an embodiment where $\Gamma$=50 MPa/μ and h is 2 μm, there is an average residual stress of −150 MPa Although the stress distribution in other embodiments differs from the exemplary linear embodiment, it will be qualitatively similar. Under these conditions the upward deflection along the beam will be $$\delta(x) = \frac{\Gamma}{2E} x^2, \quad (1)$$

where x is measured from the anchor 204, as depicted in FIG. 2. Thus, for an embodiment where L=100μ and E=140 GPa, the static tip deflection, $\delta(L) \cong 1.8\mu$. Hence, the maximum deflection $\delta_{max}$ is approximately two microns, or about the same as the thickness h of the resonator 205.

In an alternate embodiment, a resonator has a strain gradient across a thickness such that a bottom resonator surface, proximate to a substrate, is deformed by a lesser amount than a top resonator surface, distant from a substrate to be statically deflected out-of-plane in a direction toward the substrate.

In an embodiment, a resonator statically deflected out-of-plane is driven to resonate in an out-of-plane mode. Thus, during operation, the amount of out-of-plane deflection is varied from the maximum static deflection z depicted in FIG. 2. In certain embodiments, the magnitude of maximum dynamic displacement (e.g., at cantilever tip 208) is less than the magnitude of maximum static deflection or displacement z. Because the static deflection due to the residual stress may lift the cantilever tip 208 completely out of the plane of the electrode 210, this portion of the electrode becomes ineffective in driving the resonator in an in-plane mode. However, the out-of-plane modes of particular embodiments described elsewhere herein are driven efficiently because of the static out-of-plane deflection.

Figure 3A:
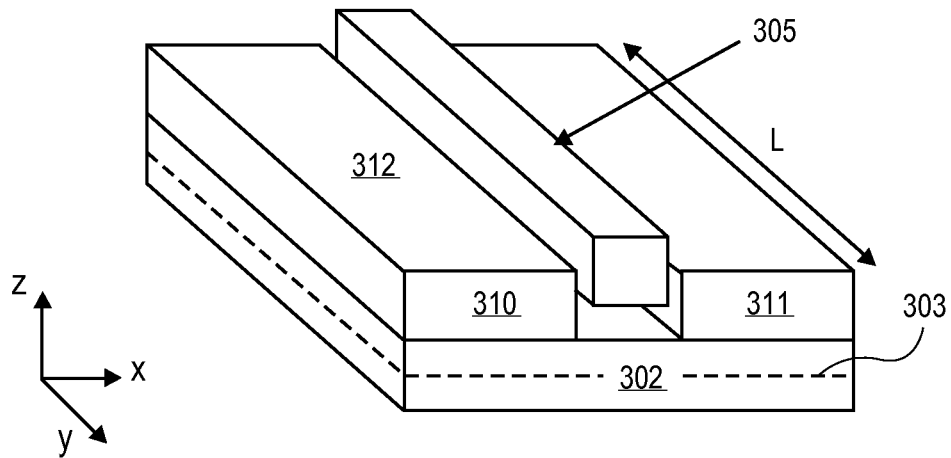
FIG. 3A illustrates an isometric view of a cantilever beam deflected out-of-plane, in accordance with an embodiment.
Figure 3B:
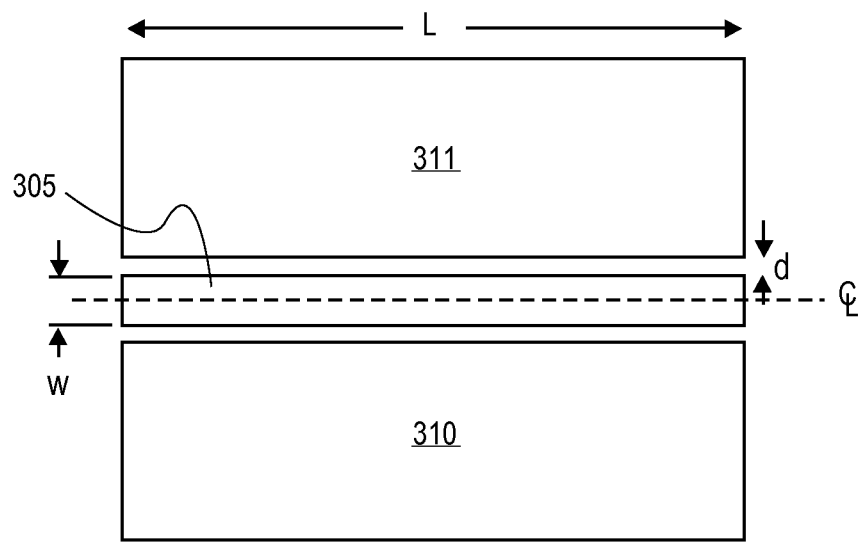
FIG. 3B depicts a plan view of the cantilever beam of FIG. 3A, in accordance with an embodiment.
Figure 3C:
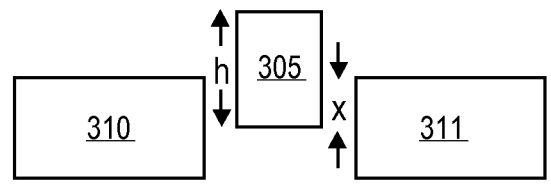
FIG. 3C depicts a cross-sectional view of the cantilever beam of FIG. 3A, in accordance with an embodiment.

Generally, for electrostatic driver embodiments, in response to a voltage applied between an electrode and a resonator, the resonator will dynamically deform so as to increase its capacitance. The difference in out-of-plane deformation of the resonator compared to the electrodes may therefore be utilized to drive an electrostatically actuated resonator. FIGS. 3A, 3B and 3C illustrate an isometric view, a plan view, and a cross-sectional view, respectively, of a portion of an exemplary resonator 305 that is out of electrode plane 312. As further depicted, electrode plane 312 is parallel to substrate plane 303, which is parallel to the major surface of substrate 302 supporting the resonator 305 and electrodes 310, 311.

As further shown in FIG. 3B, a surface along a length of the resonator 305 is spaced apart from a surface of electrodes 310 and 311 to form a gap d. In a particular embodiment, the gap d remains substantially constant when the resonator is statically deflected out-of-plane and also remains substantially constant when driven to dynamically deform out-of-plane. In other words, for such embodiments, the in-plane electrostatic driving force is symmetrical. In the exemplary arrangement depicted in FIGS. 3A-3C, the electrostatic driving force may be made symmetrical in-plane about the resonator 305 by applying an approximately equal voltage, in phase, to both electrodes 310 and 311 so that there is a net out-of-plane electrostatic force, but no significant net in-plane electrostatic force. Thus, a longitudinal centerline CL of resonator 305 remains at a constant distance from both electrode 310 and 311 (i.e., the gap d remains constant). The gap d may be characterized in terms of gap aspect ratio (h:d). Generally, this gap ratio is to be higher than approximately 5:1. In certain embodiments, therefore, the gap d will be less than 200 um. In particular embodiments, where the structural mode of the resonator 305 is either flexural or torsional, the gap d is less than approximately 2 micrometers (μm).

The capacitance as a function of the overlap distance x, as depicted in FIGS. 3A, 3B and 3C, may be approximated as C(x)=2∈$_0$Lx/d and the transduction η is $$\eta = V \frac{\partial C}{\partial x} = 2\varepsilon_0 V \frac{L}{d}. \quad (2)$$

During operation, the electrodes 310 and 311 create a force which tends to increase the capacitance of the resonator 305; a force which draws the center plate into the gap between the electrodes 310 and 311. Thus, when driven, the capacitance is increased by increasing the total area of the capacitor and not by decreasing its gap as in the conventional MEMS device 100. The factor 2L in the transduction is the total length which the electrodes 310 and 311 present to the resonator 305. Equation 2 may be generalized as:

$$\eta = \varepsilon_0 V \frac{P}{d}, \quad (3)$$

where P ("perimeter") denotes the total length of the faces of all the electrodes which are adjacent to the resonator (e.g., electrodes 310 and 311). Advantageously, the transduction is independent of the overlap distance x. This means, for instance, that there is no electrostatic spring softening with this design and no associated pull-in voltage. Such devices are often called "linear" because the static capacitance is linearly dependent on the deflection distance so that the transduction and the frequency are independent of the deflection distance. This makes the frequency independent of the bias voltage applied to electrodes 310 and/or 311 as well.

An important electrical characteristic of a resonator is its motional resistance. In terms of the resonator 305, the motional resistance may be approximated as:

$$R_x = \frac{2\pi f_0 m d^2}{Q(\varepsilon_0 V P)^2}, \quad (4)$$

where $f_o$ is the resonator frequency, m is an effective mass, Q is the quality factor of the resonator, and V is the voltage difference between the resonator body and the electrodes 310, 311.

In particular embodiments, a thickness-to-width ratio of the resonator (h:w), is less than one. The h:w ratio of certain vertical mode devices described herein may be much lower than one, as opposed to equal to or higher than one for typical lateral mode devices because vertical mode electrostatic transduction has a dependence on perimeter P while lateral mode electrostatic transduction has a dependence on resonator sidewall area, which increases with increasing h.

Figure 4A:
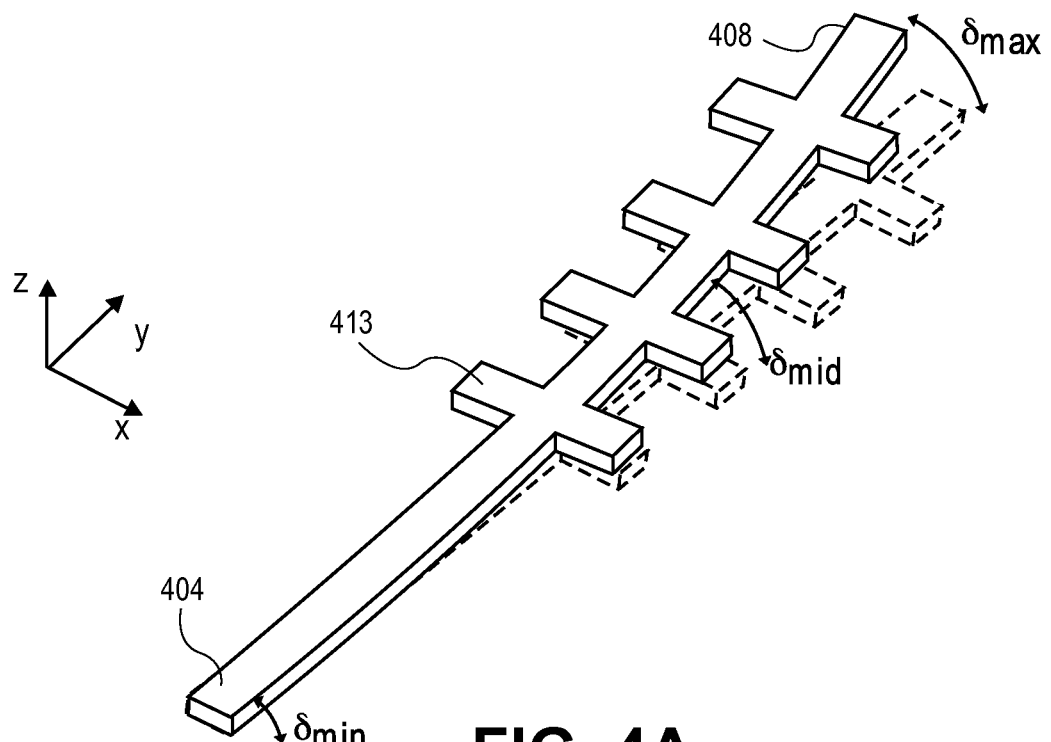
FIG. 4A depicts a resonator deflected out-of-plane and further including comb teeth, in accordance with an embodiment.

In an embodiment, a MEMS device includes a resonator, with a plurality of comb teeth, statically deflected out-of-plane. FIG. 4A depicts an exemplary flexural mode resonator 405 including a plurality of comb teeth 413. In FIG. 4A, the solid lines represent the position of the resonator 405 as statically deflected out-of-plane while the dashed lines represent the in-plane, undeflected position of the resonator 405. In one embodiment, the resonator 405 is a cantilevered beam coupled to a substrate through an anchor 404. As depicted, in response to a residual stress gradient, resonator 405 is deflected out-of-plane, along the longest linear dimension, by a minimal amount $\delta_{min}$ proximate to the anchor 404, by a maximum amount $\delta_{max}$ at cantilever tip 408 and by an intermediate amount $\delta_{mid}$ at a midpoint. In this exemplary embodiment, the central beam of the resonator 405 is approximately 100 µm long and 1.8 µm wide and the film thickness (i.e., height of structure) is 2 µm. There are 20 comb teeth 413 per side and each tooth is 1 µm wide and 6 µm long. For such an embodiment, the maximum static deflection $z_{max}$ is approximately 1.8 µm, with $z_{min}$, approximately 0 µm and $z_{mid}$ between 0.5 µm and 1.0 µm. In further embodiments, where the length of comb teeth 413 approaches the length of the longest linear dimension, comb teeth 413 may also be statically deflected out-of-plane.

In an embodiment, a MEMS device includes a resonator, with a plurality of comb teeth, statically deflected out-of-plane and configured to resonate in an out-of-plane mode. In specific embodiments, comb teeth are spaced apart to be adjacent to opposing surfaces of one or more electrodes. The additional perimeter P provided by the plurality of comb teeth improves the transduction efficiency relative to the resonator 305 of FIGS. 3A-3C, lowering the motional resistance of the resonator 405. In certain embodiments, the electrodes to drive a resonator include an electrode having teeth of similar dimension which are interdigitated with the comb teeth of the resonator. For example, as depicted in FIG. 4B, comb teeth 413 are interdigitated with electrode 410 to have opposing surfaces of an electrode tooth adjacent to two comb teeth 413.

Figure 4B:
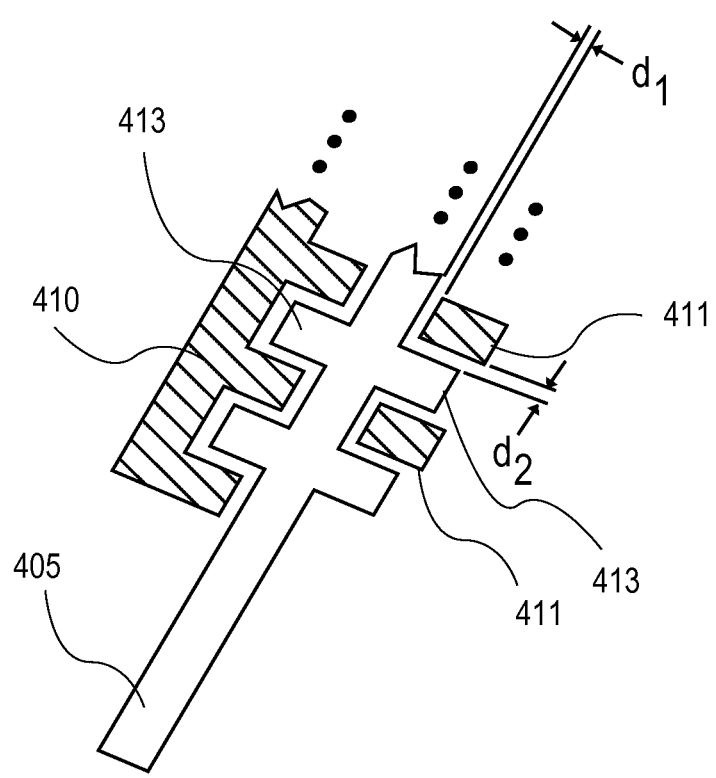
FIG. 4B depicts a plan view of the resonator of FIG. 4A coupled with an interdigitated electrode.

In an alternative embodiment, there may be a plurality of electrodes 411 on either or both sides of resonator 405, as further depicted in FIG. 4B, with an electrode 411 of the plurality surrounded on two opposing sides by two adjacent comb teeth 413. In such a configuration, the plurality of electrodes may then be driven in-phase or out-of-phase across the plurality. In advantageous embodiments, where any combination of the electrode configurations depicted in FIG. 4B is positioned on both sides of resonator 405, gaps $d_1$ and $d_2$ between the resonator and two dimensions of the perimeter area of the electrode remain approximately constant in the resonant mode because net in-plane electrostatic forces along the length of resonator 405 are minimal.

Figure 5A:
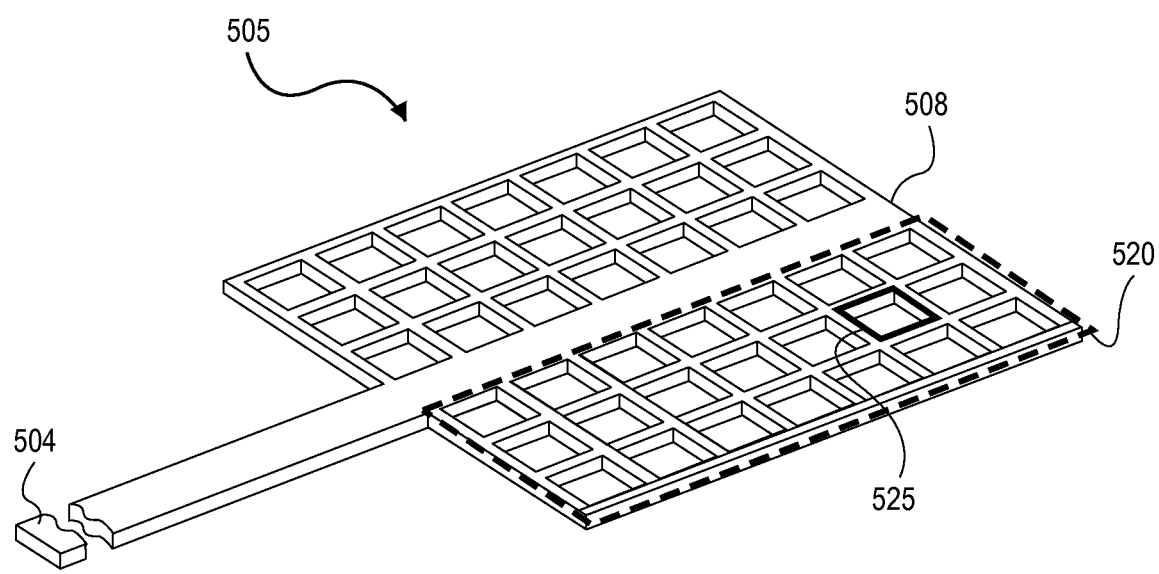
FIG. 5A depicts an isometric view of a flexural mode resonator including a lattice transducer, in accordance with an embodiment.

In a further embodiment, a MEMS device includes a resonator, with a lattice transducer, statically deflected out-of-plane. FIG. 5A depicts an isometric view of a flexural mode resonator 505 including a lattice transducer 520, in accordance with an exemplary embodiment. Resonator 505 is to be coupled to a substrate via anchor 504 and includes a central beam extending from the anchor 504 to cantilever tip 508. In this exemplary embodiment, the central beam is approximately 150 µm long and 10 µm wide, and the resonator thickness (height) is approximately 2 µm. The lattice beams making up the lattice transducer 520 are approximately 2 µm wide and a square lattice opening 525 is approximately 10 µm on a side for a lattice opening perimeter of 40 µm. The lattice transducer 520 includes 21 lattice openings 525 and when replicated on both sides of the central beam, a total of 42 such holes provides a perimeter of 1680 microns. The perimeter factor for this example is P≈4Ns where N is the number of square holes of side length s. Assuming a similar quality factor and frequency as in the exemplary resonator of FIG. 3A-3C, the motional resistance of the resonator 505 is approximately 120 kOhms.

In other embodiments, lattice opening 525 may be rectangular or circular, hexagonal, etc. in shape to achieve a high ratio of perimeter length to lattice opening area because transduction is increased by increasing the density of holes in the lattice. If the total lattice area A is held constant, then the number of holes which can be accommodated is approximately $A/(s+l)^2$, where l is the width of the lattice beams forming the lattice transducers 520 and 521. Hence, the perimeter is approximately $P \approx 4sA/(s+l)^2$ 4A/s, where the latter approximation is valid when s>>l. In practice, the size of an electrode surrounded by the lattice opening 525 is limited by the fabrication process so that this inequality will usually be valid.

In certain embodiments, regardless of the perimeter shape of lattice opening 525, the lattice openings of the lattice transducer 520 may be of a same or varied perimeter across a plurality of lattice openings. For example, with a lattice transducer, larger perimeter lattice openings may be positioned proximate to the anchor 504 while smaller perimeter lattice openings may be positioned proximately to the cantilever tip 508, or vice-versa.

Figure 5B:
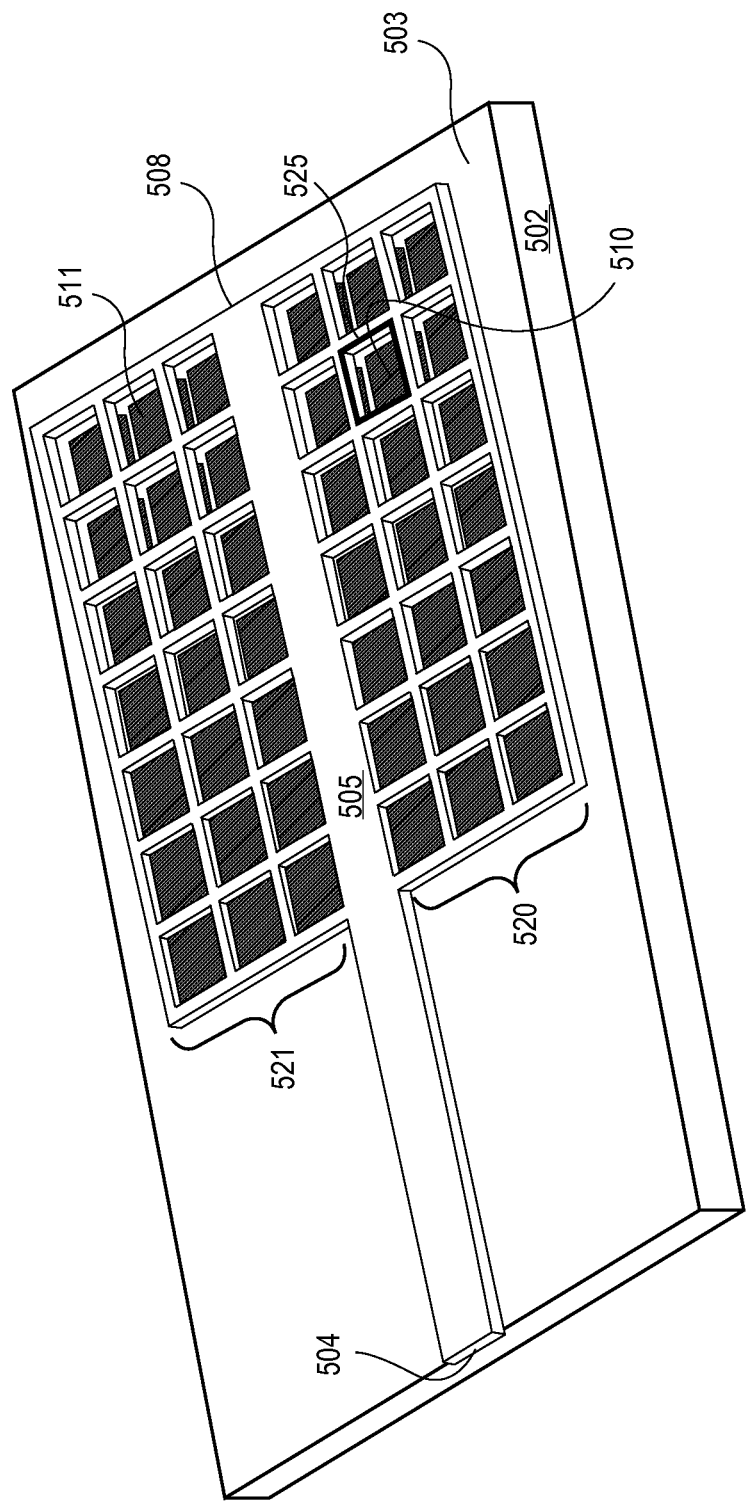
FIG. 5B depicts an isometric view of the resonator in FIG. 5A, deflected out of a plane of an electrode surrounded by a perimeter of lattice beams of a lattice transducer, in accordance with an embodiment.

FIG. 5B depicts an isometric view of the resonator 505 from FIG. 5A coupled to substrate 502 through anchor 504. The resonator 505 is statically deflected out-of-plane to have a portion of the resonator 505 out of a plane of an electrode 510. In this particular example, the resonator 505 is also deflected away from the plane 503 of the substrate 502. In this exemplary embodiment, each lattice opening 525 within lattice transducers 520 and 521 forms a perimeter of lattice beams around an electrode 510 or 511. Unlike the resonator 505, since the electrodes are anchored to substrate 502, their position is preferably little affected by any stress gradient that may be present in their material (e.g., remaining nominally in-plane).

Figure 6A:
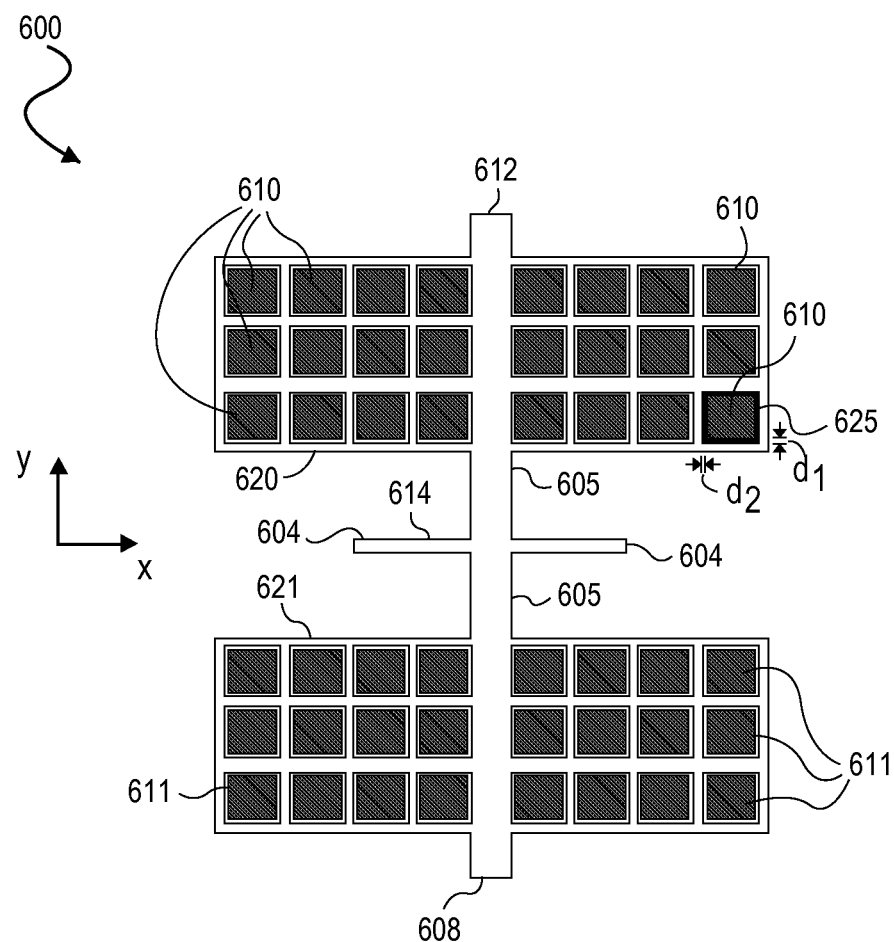
FIG. 6A depicts a plan view of a torsional mode resonator including a lattice transducer, in accordance with an embodiment.

In an alternative embodiment, a torsional mode resonator has a lattice transducer and is statically deflected out-of-plane. In such embodiments, a torsional structural mode generates a target frequency rather than a flexural structural mode. As an example that the out-of-plane transduction mechanisms described herein do not depend on the type of structural mode, FIG. 6A depicts a plan view of a torsional mode resonator 600 having a lattice transducer. In the depicted embodiment, a central beam 614 is to be coupled to a substrate (not depicted) via the two anchors 604. As further depicted, the lattice opening 625 forms a perimeter around an electrode 610, spaced apart from the electrode by $d_1$ and $d_2$, which are preferably equal. Electrodes 610 and 611 are to be anchored to a substrate, preferably to remain in-plane.

In one such embodiment, the central beam 614 is approximately 71 µm long and about 3.3 µm wide. The secondary beam 605 which connects the two lattice transducers 620 and 621 has a total length from tip 608 to tip 612 of approximately 150 µm and is about 10 µm wide. The lattice transducers 620 and 621 each consists of lattice beams about 2 µm wide with square lattice openings 625 of about 14.5 µm on a side. The total width of each lattice transducer 620 and 621 is about 160 µm with each having 24 lattice openings 625 for a total perimeter for each side of 1400 microns. The motional resistance of this device is approximately 80 kOhms, which one of skill in the art will appreciate is nearly the 50 kOhms resistance, typical of a quartz resonator. In other embodiments, lattice openings 625 may be of non-square shape and/or of varying perimeters across a plurality of lattice opening 625.

Figure 6B:
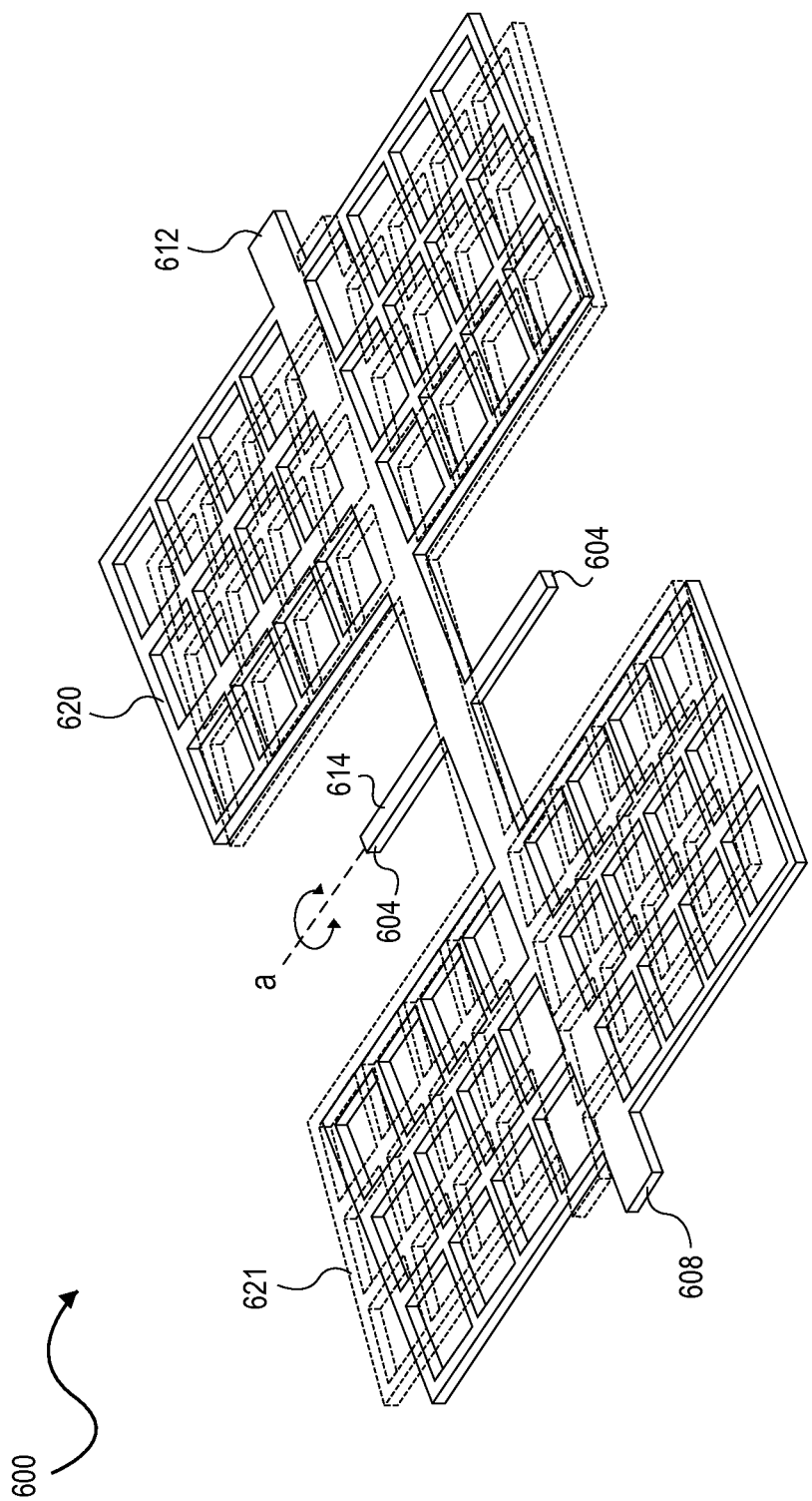
FIG. 6B depicts an isometric view of the torsional mode for the resonator of FIG. 6A, in accordance with an embodiment.

FIG. 6B depicts an isometric view of the torsional mode for the resonator 600 of FIG. 6A. As depicted, during operation, central beam 614 undergoes a torsional deformation about an axis a between the anchors 604 as cantilever tips 608 and 612 dynamically deflect in response to an out-of-plane electrostatic force imparted on lattice transducers 620 and 621 when either or both are driven with an AC signal.

Figure 6C:
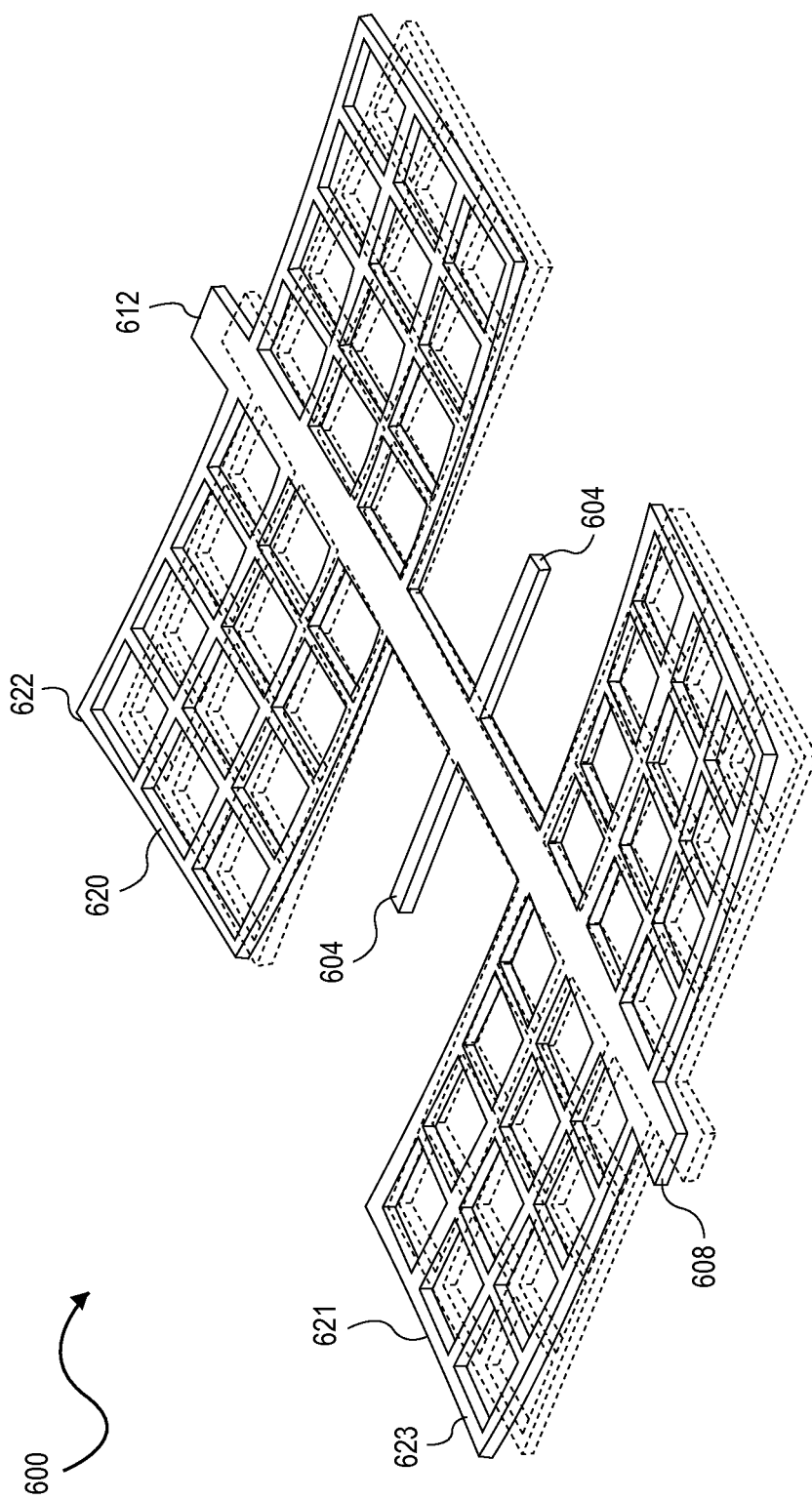
FIG. 6C depicts an isometric view of the torsional mode resonator of FIG. 6A statically deflecting out-of-plane, in accordance with an embodiment.

FIG. 6C depicts an isometric view of the resonator 600 of FIG. 6A statically deflected out-of-plane, in accordance with an embodiment. As depicted, out-of-plane static deflection occurs both along the length between cantilever tips 608 and 612 and along the lengths of the lattice transducers 620 and 621 such that the maximum deflection is about one micron at the tips of the lattice. In this exemplary embodiment, the lattice height, as well as the electrode height (not shown), is two microns, so the deflection of this device due to a residual stress gradient in the film from which the resonator is formed is one micron above the plane of the electrodes.

In a further embodiment, a resonator statically deflected out-of-plane and configured to resonate in an out-of-plane mode includes a frequency tuning plate. As described elsewhere herein, the transduction mechanism described for particular embodiments has little or no electrostatic spring softening. However, it is often desirable to have a small frequency dependence on the bias voltage so that the frequency of the resulting oscillator can be trimmed after manufacturing. In the cantilever beam embodiment depicted in FIG. 7, a tuning plate 730 is coupled to an end of resonator 705 opposite anchor 704. The tuning plate 730 is positioned above an electrode 740. In a preferred embodiment, the electrode 740 is embedded in the substrate below the plane of a drive electrode (e.g., electrode 510 in FIG. 5B) to ensure the electrode 740 is not contacted when resonator 705 is driven to resonate. Electrode 740 may be a metal or any other material capable of providing a voltage relative to the resonator 705.

When a voltage difference is applied between the resonator 705 and the electrode 740, an electrostatic spring softening effect may be created, allowing the frequency to be tuned in response to the applied voltage (e.g., downwards as the voltage is increased). Because the electrode 740 is independent of drive electrode(s) positioned within the lattice transducer 720, frequency may be independently tuned. The size of the tuning plate is dependent on the size of the resonator 705 and the amount of spring softening desired. In an exemplary embodiment, for a central beam that is about 135 μm long and approximately 10 μm wide, the tuning plate 730 is approximately 30 by 40 μm.

In another embodiment, a resonator statically deflected out-of-plane and configured to resonate in an out-of-plane mode includes first and second materials having different Young's modulus dependence on temperature. The Young's modulus of typical MEMS materials, such as polysilicon (Si) and silicon germanium (SiGe), often have a strong dependence on temperature. Therefore, the frequency of a resonator fabricated from such a material will also have a strong temperature dependence. The frequency of the in-plane mode of a cantilever beam resonator is given by:

$$f = 0.16 \frac{w}{L^2} \sqrt{\frac{E}{\rho}}, \quad (5)$$

where w is the width of the resonator beam and L its length, E is the resonator material Young's modulus and ρ its density. The Young's modulus of polysilicon (in GPa) as a function of temperature has been measured as $E(T) \approx 159.4(1-2.6 \times 10^{-4}T)$. With all other variables constant as a function of temperature, the frequency is approximately $f(T) \approx f_0(1-1.3 \times 10^{-4}T)$. Thus, the frequency decreases as a function of temperature at the rate of 130 ppm (parts per million) per degree Celsius (° C.). Similarly, the temperature coefficient of frequency (TCF) is negative for a homogeneous SiGe resonator (e.g., approximately $-33 \times 10^{-6}$/° C. or −33 ppm/° C.).

The Young's modulus temperature coefficient of the second material need only be different than the first material over the operational range of the MEMS device. Therefore, any material having a different Young's modulus temperature coefficient than the first material over the typical operating range of approximately −30° C. to 90° C. may be employed as the second material. In one embodiment, a resonator comprises a first material with a negative Young's modulus temperature coefficient and the second material with a positive Young's modulus temperature coefficient. In a further embodiment, the first material is a semiconductor, such as, but not limited to, silicon (Si), germanium (Ge), and SiGe alloys while the second material is a dielectric, such as, but not limited to amorphous silica (silicon dioxide) and diamond.

In a further embodiment, the dimensions and location of the second material in the resonator is tailored to meet the resonator TCF specifications for a particular application. In another embodiment, the second material is isolated to a region(s) of the resonator proximate to a point(s) of maximum stress of the resonator. In a further embodiment, the second material is located in a region(s) of the resonator proximate to a point(s) of maximum stress and minimum displacement (during operation) within the resonator. For example, a second material may be isolated to specific areas of the resonator to reduce changes to the resonator's mode shape by reducing the effects of sound velocity mismatch between the material and the first material. Selectively locating the second material only to isolated regions decouples the effect of the second material's TCF from the effect of other temperature dependent properties of the second material (e.g., temperature coefficient of expansion).

In a particular embodiment, a resonator statically deflected out-of-plane includes a second material within a trench formed in a first material. Embodiments at least partially embedding a second material in a trench formed in a first material increases the ability to counter the Young's modulus temperature coefficient of the first material because stress loading on the second material during resonator operation becomes more normal or less shear. Herein, the meaning of a trench is a lithographically defined depression in the first material extending through at least a portion of the first material. In particular embodiments, the trench extends entirely through the first material. Embedding a second material in a trench essentially forms a plug of the second material extending between the top surface and bottom surface of the first material. Alternatively, embedding a second material in the trench fills a well having a bottom floor comprising the first material. A trench may be of any general shape, such as round, square, or annular (i.e., a ring).

In a specific embodiment, the shape, dimensions, location and arrangement of a second material comprising silicon dioxide is tailored so that a resonator comprising a first material of SiGe will have a TCF of a much lower magnitude than that of either a resonator of homogeneous SiGe or homogeneous silicon dioxide (silicon dioxide having a Young's modulus (in GPa) as a function of temperature over a similar range of approximately $E(T) \approx 77.0(1+1.7 \times 10^{-4} T)$).

Figure 7:
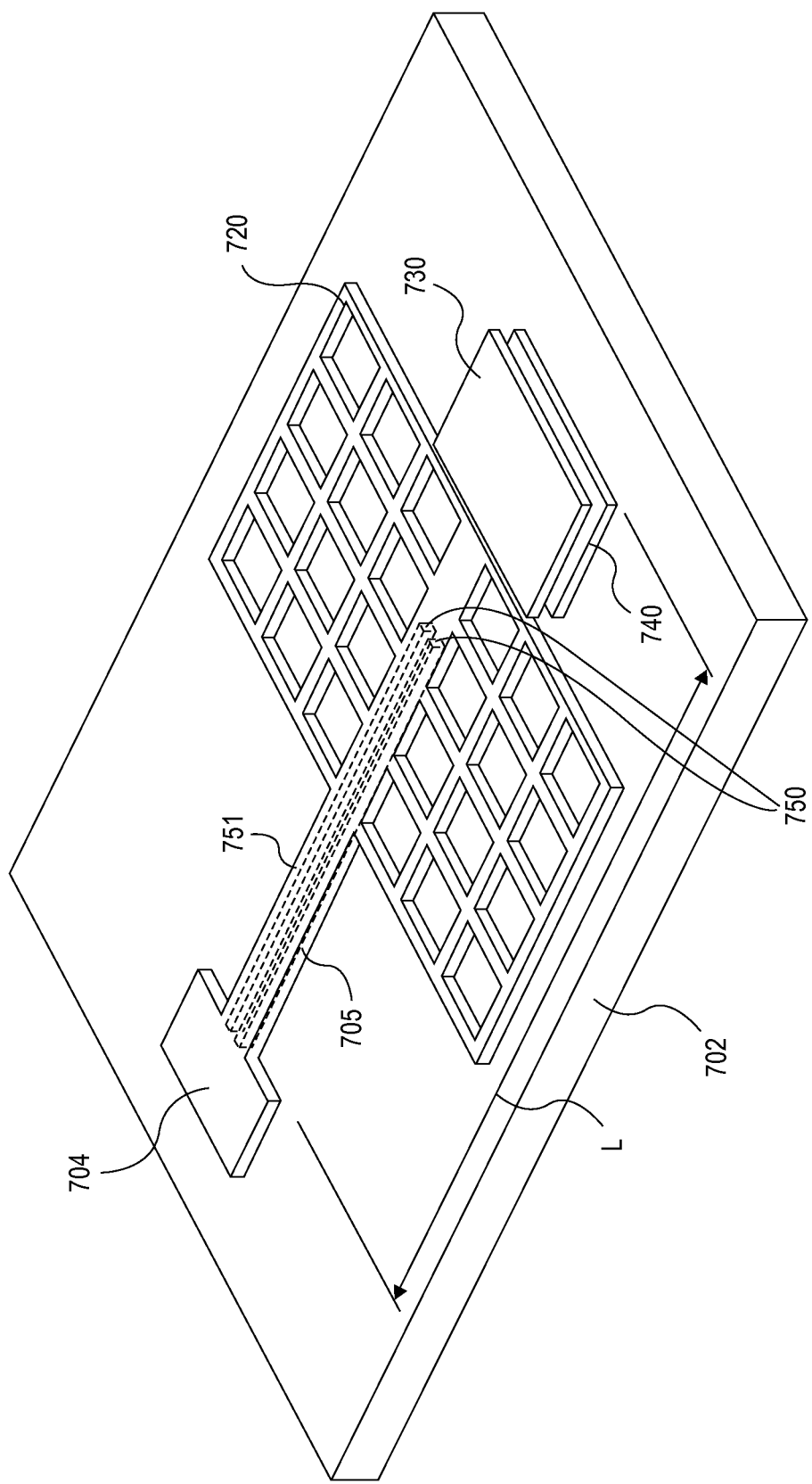
FIG. 7 depicts an isometric view of a resonator including a lattice transducer, a frequency tuning plate and first and second materials having different Young's modulus dependence on temperature, in accordance with an embodiment.

In FIG. 7, the resonator 705 includes a first structural material 751 (e.g., SiGe) with a Young's modulus that decreases with temperature and a second structural material 750 with Young's modulus that increases with temperature (e.g., silicon dioxide). The extent of the longitudinal stiffness provided by the second structural material 750 is tailored by dimensioning the length (e.g., portion of L) and thickness. For a particular embodiment where the width w, thickness h and length L dimensions of resonator 705 are similar to those of the resonator in FIGS. 5A and 5B, filled trenches of the second structural material 750 are approximately 2 μm wide, 106 μm long and have a separation of approximately 2 μm.

In still other embodiments, a resonator statically deflected out-of-plane and configured to resonate in an out-of-plane mode includes first and second materials having different coefficient of thermal expansion (CTE). In one embodiment, this CTE mismatch between the first and second materials is at least $1.0 \times 10^{-6}/°$ C. In an embodiment, the first material/second material pairs an insulator with a semiconductor. For example, the first material may be silicon, germanium, or an alloy thereof, while the other is comprised of silicon dioxide. A resonator including materials having different CTE may be engineered to induce physical changes in the resonator (e.g., moment of inertia) to induce a frequency dependence on temperature that counters an intrinsic frequency dependence of the resonator materials (e.g., effective mass of resonator may be reduced in response to an increase in temperature and, hence, the relative resonant frequency at a given temperature increased for a resonator having a resonant frequency that would otherwise decrease with increasing temperature). Thus, a means of frequency compensation may be invoked for resonator embodiments of the present invention.

Figure 8A:
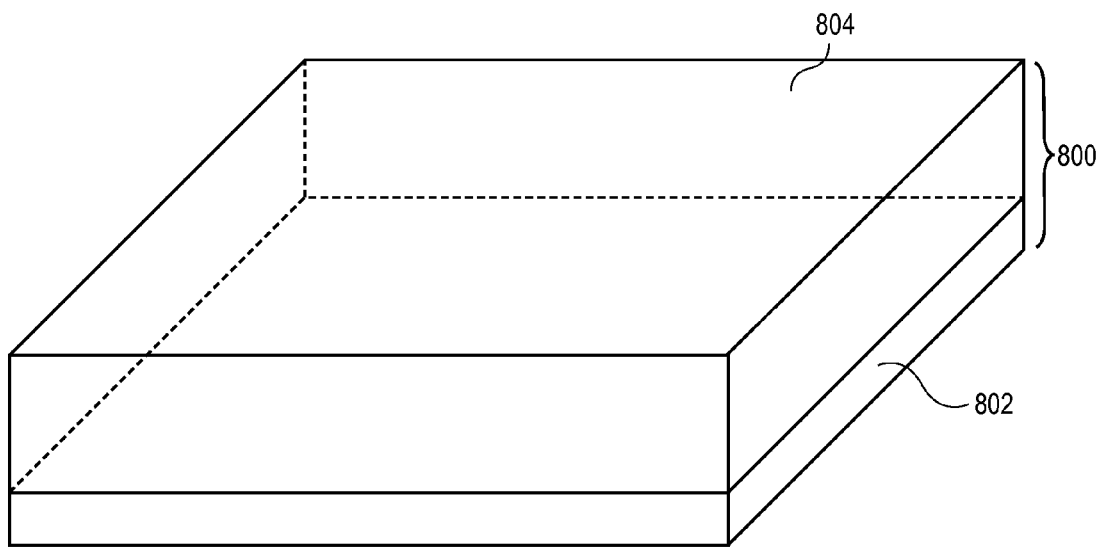
FIGS. 8A-8F depict isometric views of intermediate structures in a method to fabricate a resonator, in accordance with an embodiment.

FIGS. 8A-8F depict isometric views of intermediate structures in a method to fabricate a resonator, in accordance with an embodiment. Referring to FIG. 8A, a stacked structure 800 is provided comprising a substrate 802 and a release layer 804. Substrate 802 may be of any material suitable to withstand a MEMS fabrication process and to provide structural integrity for MEMS structure 800. In an embodiment, substrate 802 is of group IV-based materials such as, but not limited to, crystalline silicon, germanium or silicon/germanium. In another embodiment, substrate 802 is of a III-V material. Substrate 802 may also include an insulating layer. In one embodiment, the insulating layer is of a material such as, but not limited to, silicon dioxide, silicon nitride, silicon oxy-nitride and a high-k dielectric layer. Substrate 802 may be an insulator. In one embodiment, substrate 802 consists of glass, quartz or sapphire. Substrate 802 may include a fabricated integrated circuit. For example, in accordance with an embodiment of the present invention, substrate 802 comprises an insulator layer above a plurality of interconnect structures connecting a plurality of micro-electronic devices, wherein MEMS structure 800 is fabricated above the insulator layer.

Release layer 804 may be of any material suitable to withstand a MEMS fabrication process. For example, in accordance with an embodiment of the present invention, release layer 804 is an insulator such as, but not limited to, silicon dioxide, silicon nitride, silicon oxy-nitride and a high-K dielectric material having a greater dielectric constant than silicon nitride. In another embodiment, release layer 804 is a semiconducting material, such as, but not limited to, silicon, germanium, silicon/germanium, carbon-doped silicon and a III-V material. The semiconducting material may also include dopant impurity atoms. For example, in one embodiment, the semiconductor material is germanium and the concentration of dopant impurity atoms is selected to optimize the germanium nucleation at a temperature in the range of 300-400° C. Release layer 804 may be formed on substrate 802 by any suitable deposition process that generates uniform material layers of consistent composition. For example, in accordance with an embodiment of the present invention, release layer 804 is deposited by a process, such as, but not limited to, chemical vapor deposition (CVD), physical vapor deposition (PVD), atomic layer deposition (ALD), electroplating and electro-less plating.

Figure 8B:
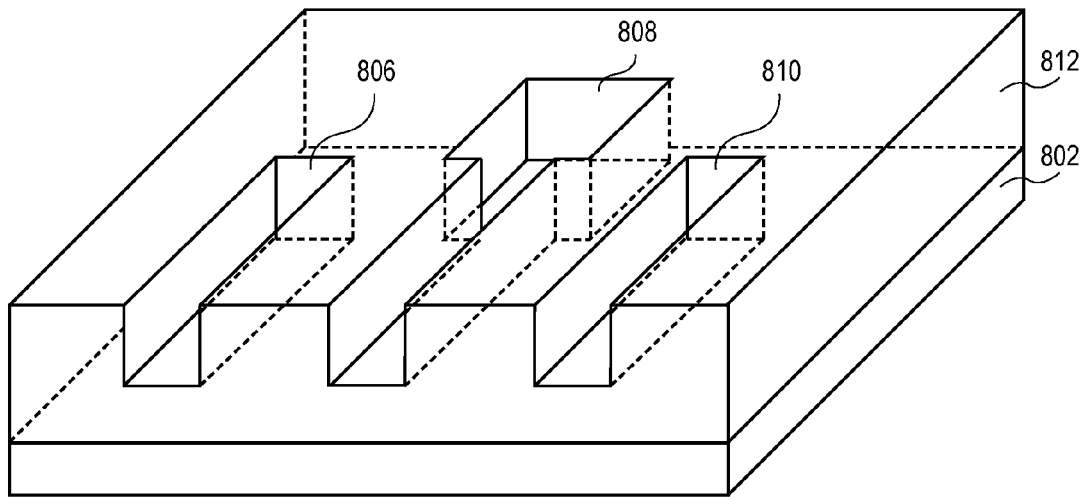

As depicted in FIG. 8B, trenches 806, 808 and 810 may be formed in release layer 804 to form partially patterned release layer 812 above substrate 802. Release layer 804 may be patterned by any lithographic/etch process suitable to provide appropriately sized trenches with a depth less than the thickness of release layer 804. For example, in accordance with an embodiment of the present invention, release layer 804 is patterned by first patterning a positive photo-resist layer above release layer 804 by exposure to a wavelength of light, such as, but not limited to, 248 nm, 193 nm and 157 nm. In another embodiment, an e-beam direct-write process is used to pattern the positive photo-resist layer. An etch process may then be used to pattern release layer 804. In one embodiment, a dry etch process is used. In a particular embodiment, release layer 804 is comprised substantially of germanium and the dry etch process comprises an anisotropic plasma etch process wherein the plasma is generated from gases, such as, but not limited to, $SF_6$, $CF_4$ and the combination of HBr, $Cl_2$ and $O_2$. In one embodiment, a hard-mask layer is utilized in between the positive photo-resist and release layer 804. The depth of the trenches 806, 808 and 810 may be any depth described in association with the thickness, h, of a resonator, such as any of those from FIGS. 2-7.

Figure 8C:
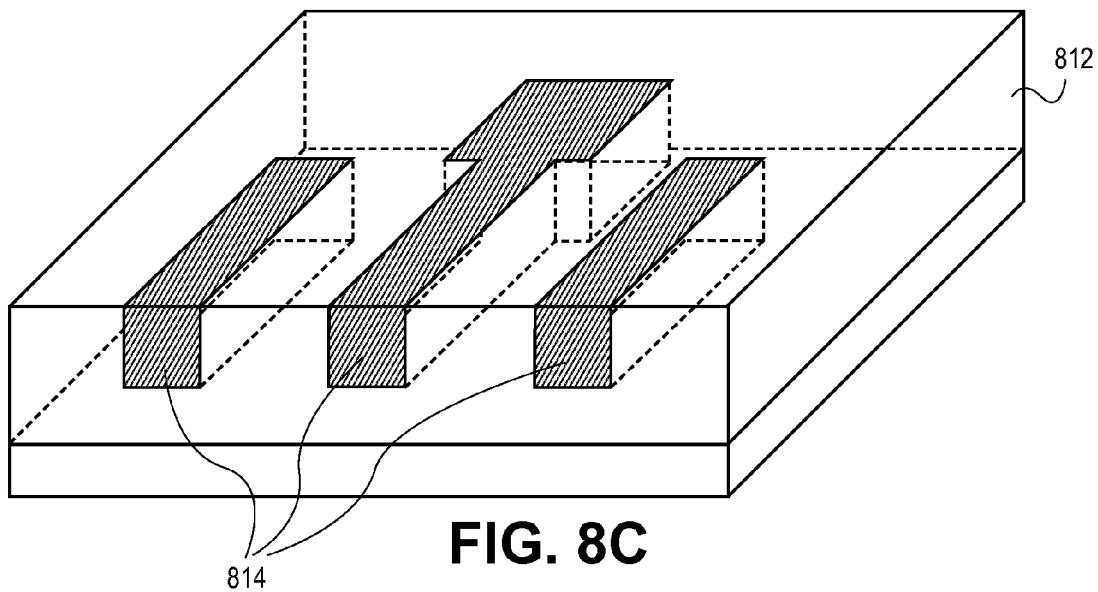

As depicted in FIG. 8C, trenches 806, 808 and 810 in partially patterned release layer 812 may be filled with a structural layer 814. In accordance with an embodiment of the present invention, structural layer 814 is formed by first blanket depositing a material layer above partially patterned release layer 812 and in trenches 806, 808 and 810.

The structural layer 814 may be one or more films of an insulator, a semiconductor and a conductor. In one embodiment, structural layer 814 is a semiconducting material, such as, but not limited to, silicon, germanium, silicon/germanium, carbon-doped silicon, carbon-doped silicon/germanium and a III-V material. The semiconducting material may also include dopant impurity atoms. For example, in a specific embodiment, structural layer 814 is polycrystalline silicon/germanium with a germanium atomic concentration in the range of 50-70% and boron dopant impurity atoms with a total atomic concentration in the range of $1 \times 10^{18}$-$5 \times 10^{20}$ atoms/cm$^3$. Other dopant species include carbon (C) and oxygen (O).

In one embodiment, the structural layer 814 is formed with a stress which varies spatially to deflect when subsequently released from the substrate. In one such embodiment, the stress is larger (more compressive) at the bottom of the film, proximate substrate 802, and gradually lessens towards the top surface. Accordingly, when a free structure is subsequently released, the bottom of the film expands more than the top, causing the film to curl upwards at its outermost extremities. In an alternate embodiment, the stress is smaller (less compressive) at the bottom surface of the film, proximate substrate 802, and gradually increases towards the top surface. Accordingly, when a free structure is subsequently released, the top of the film expands more than the bottom, causing the film to curl downwards at its outermost extremities. Furthermore, for a structure with complex anchoring, the curling can be downwards in one part of the structure and upwards in another. In a particular embodiment, the extent of the curling is equal to or greater than the film thickness itself. For example, the structural layer 814 has a compressive stress sufficiently higher proximate to the substrate than at a thickness, distal from the substrate, to deflect the bottom surface, proximate to the substrate, above a top surface of an electrode when the structural layer 814 is subsequently released.

In one embodiment, a conventional deposition method in which the film stress can be controlled is employed, such as, but not limited to CVD and PECVD, to form a film with an intrinsic stress gradient. Intrinsic film stress can be tuned in any number of fashions, such as, but not limited to, deposition pressure, temperature and power variations. In specific embodiments, dopants (e.g., O, C, etc.) may be introduced during deposition to modulate the stress over the thickness by modulating the dopant source flow rate. The gradient of dopant over the thickness may vary grain size of the deposited film or otherwise induce a residual film stress gradient. In another embodiment, a multi-layered stack of materials, each with an intrinsic residual film stress, can be utilized to engineer a stress gradient in the structural element (e.g., a first higher stress film and a second lower stress film). In other embodiments, lattice constant mismatch between individual films in a layered stack may be utilized to form a residual stress gradient. In still another embodiment, metal-induced crystallization is employed to tune the crystallinity, and thus the residual stress gradient. For example, a specific seed layer (e.g., metal) may be introduced during the deposition to form a structural layer with a particular crystallinity and stress gradient. In other embodiments, laser recrystallization methods may be employed to alter the crystallinity of a portion of the structural layer thickness distal from the substrate (e.g., top layer) relative to a portion of the structural layer thickness proximate to the substrate (e.g., bottom layer).

As depicted in FIG. 8C, the deposited material layer may be planarized to expose the top surface of partially patterned release layer 812. As depicted, the trench 808 is spaced apart from the trench 810 such that a first structural element, such as a resonator, may be spaced apart from a second structural element, such as an electrode by a first amount. In particular embodiments where the first structural element is to include a lattice transducer, the structural layer 814 is formed in a trench 808 that forms a perimeter around the trench 810.

Figure 8D:
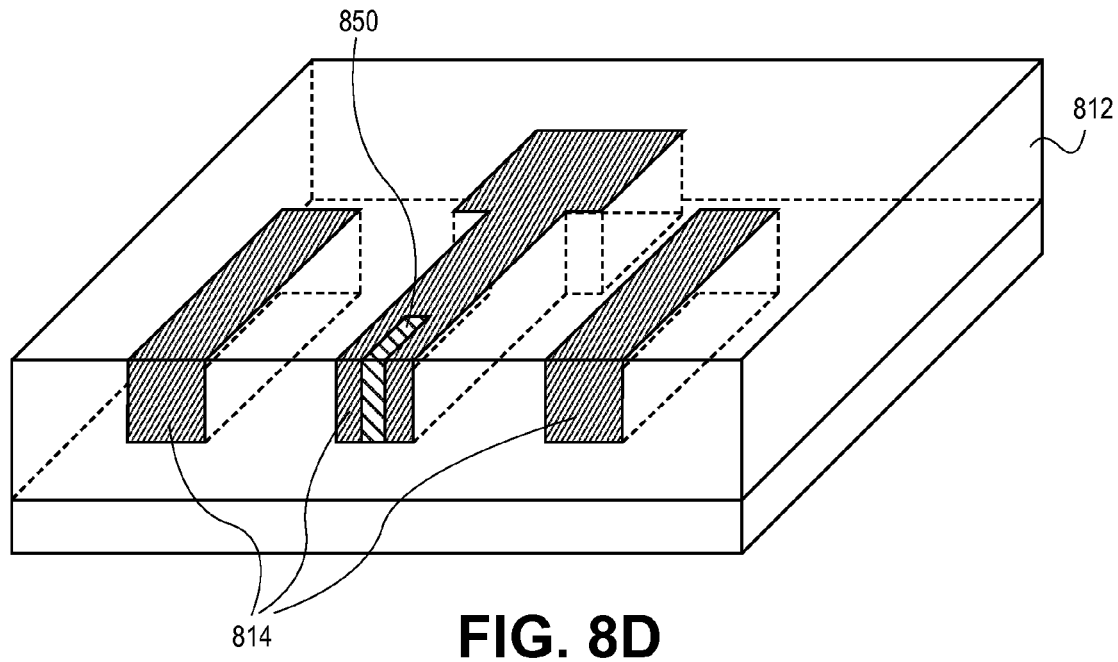

As depicted in FIG. 8D, a second structural material 850 may be embedded in a trench within structural layer 814 to provide improved TCF, as discussed elsewhere herein. Second structural material 850 may be deposited conformally or superconformally (bottom-up) to fill substantially void-free a trench that may be defined in substantially the same manner as described for trenches 806, 808 and 810. Second structural material 850 may be deposited by any conventional means, such as, but not limited to, PVD, PECVD, LPCVD, and electrochemical deposition to completely fill the defined trench. This can be done as one step, or as a sequence of thin deposition and anisotropic etch back steps until the trench is filled. Alternatively, second structural material 850 may be formed by oxidizing structural layer 814 to form second structural material 850 on the sidewalls of the defined trench. In certain embodiments, second structural material 850 is deposited at a temperature below 500° C. to be compatible with typical back end of line (BEOL) microelectronics processing. In a particular embodiment employing a structural layer 814 of SiGe, second structural material 850 is silicon dioxide and is deposited using a PECVD process at a temperature between 350° C. and 400° C. In still other embodiments (not depicted), a second structural material is formed by oxidizing the top surface of the structural layer 814. Such embodiments may be done in absence of or in combination with the embedding of second structural material 850.

Figure 8E:
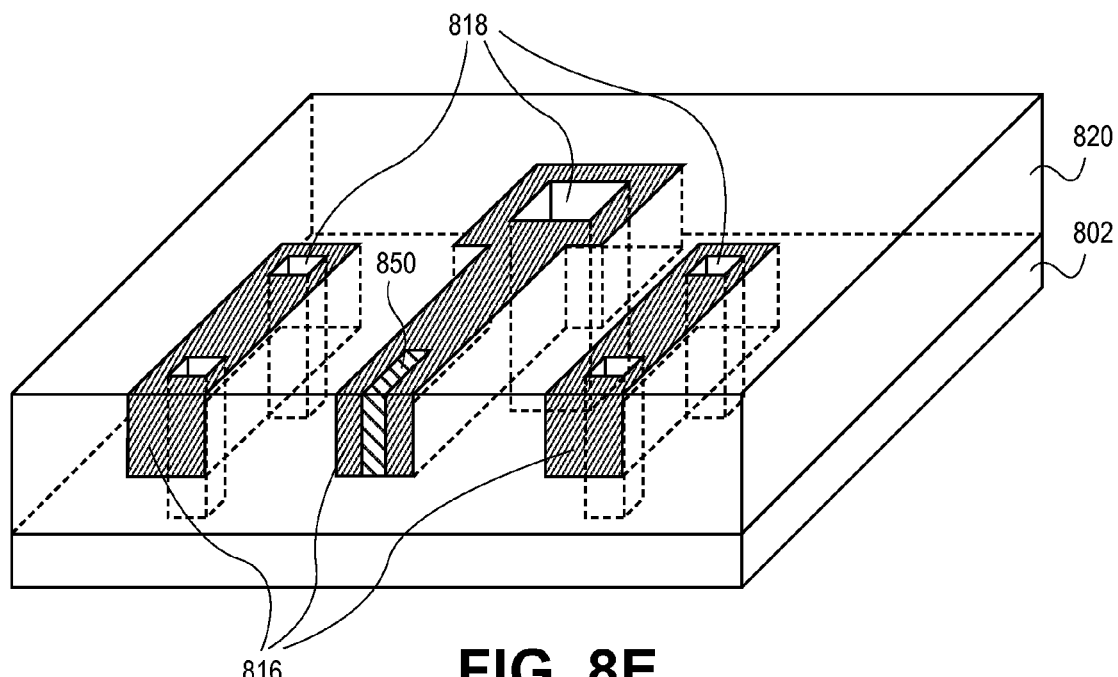

As depicted in FIG. 8E, structural layer 814 may be patterned to form patterned structural layer 816 having pre-coupler holes 818. Pre-coupler holes 818 extend through partially patterned release layer 812 to form patterned release layer 820 and land on substrate 802. Structural layer 814 may be patterned by any lithographic/etch process used to pattern structural layer 814, described in association with FIG. 8B. In accordance with one embodiment of the present invention, pre-coupler holes 818 expose electrical contact regions housed in substrate 802.

Figure 8F:
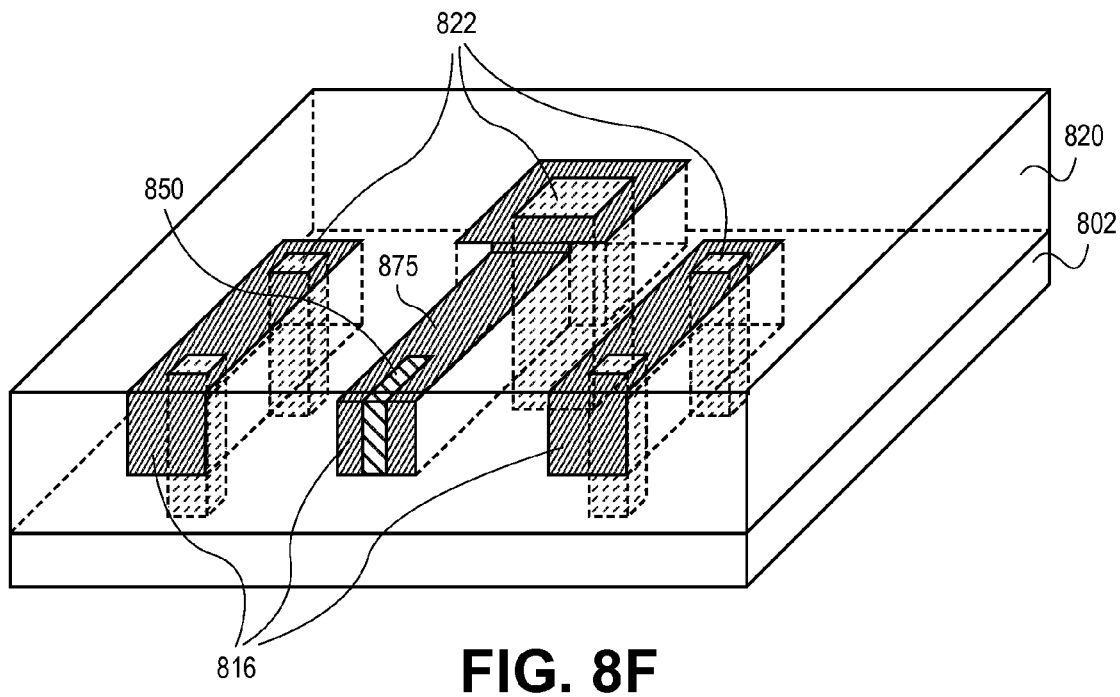

As depicted in FIG. 8F, pre-coupler holes 818 may be filled with a conductive material to form couplers 822 which extend through patterned structural layer 816. Couplers 822 may be of any conventional conductive material and deposited by any suitable technique. For example, in accordance with an embodiment of the present invention, the conductive material used to form couplers 822 is first blanket deposited above patterned structural layer 816 and in pre-coupler holes 818 and then polished back to expose the top surface of patterned structural layer 816. In an alternative embodiment, pre-coupler holes 818 expose metallic contact regions in substrate 802. The metallic contact regions act as a seed surface to form couplers 822 by a selective electroplating or electro-less plating deposition process. In a specific embodiment, couplers 822 are formed by a low-temperature deposition process, at a temperature less than approximately 450° C.

In particular embodiments, the thickness of patterned structural layer 816 is selectively modified. For example, as further shown in FIG. 8F, thinned region 875 is formed along the top surface of patterned structural layer 816. While MEMS resonators which use in-plane motion have frequencies which are not sensitive to the film thickness, the out-of-plane modes described elsewhere herein are. This is illustrated by the standard approximation of the first in-plane frequency of a cantilever beam:

$$f = 0.16 \frac{w}{L^2} \sqrt{\frac{E}{\rho}}. \tag{6}$$

Thus, for in-plane motion, the frequency depends only on the width (y dimensions) and length (x dimension) of a beam. In contrast, the first out-of-plane mode has a frequency $$f = 0.16 \frac{h}{L^2} \sqrt{\frac{E}{\rho}}, \tag{7}$$

where h is the film thickness. Thus, for out-of-plane motion the frequency does not depend strongly on a beam width. Because the beam height (film thickness) is a parameter of the process by which the beam is fabricated, a resonator of a given design utilizing an out-of-plane mode (e.g., those in FIGS. 2-7) can be tuned to any number of frequencies by varying the film thickness as part of the fabrication process. Furthermore, because the frequency of the out-of-plane mode is insensitive to beam widths, an error in a width may not cause a significant change in the frequency. For example, for cantilever beam embodiments, any errors in the fabrication process which impact a cantilever beam width should not affect the frequency of the resonator.

Thinned region 875 may be formed by any process capable of locally or globally reducing the thickness of patterned structural layer 816. Global processes may include conventional wet or dry chemical etches while localized techniques include, but are not limited to, localized polishing, focused ion beam (FIB) etching and laser ablation of patterned structural layer 816. In a specific embodiment, the structural layer is locally polished prior to releasing the patterned structural layer 816. In another specific embodiment, FIB etching of the patterned structural layer 816 is performed before releasing the patterned structural layer 816, or laser ablation of patterned structural layer 816. In still other embodiments, any of these techniques may be employed to form thinned region 875 in structural layer 814, prior to forming patterned structural layer 816.

Figure 8G:
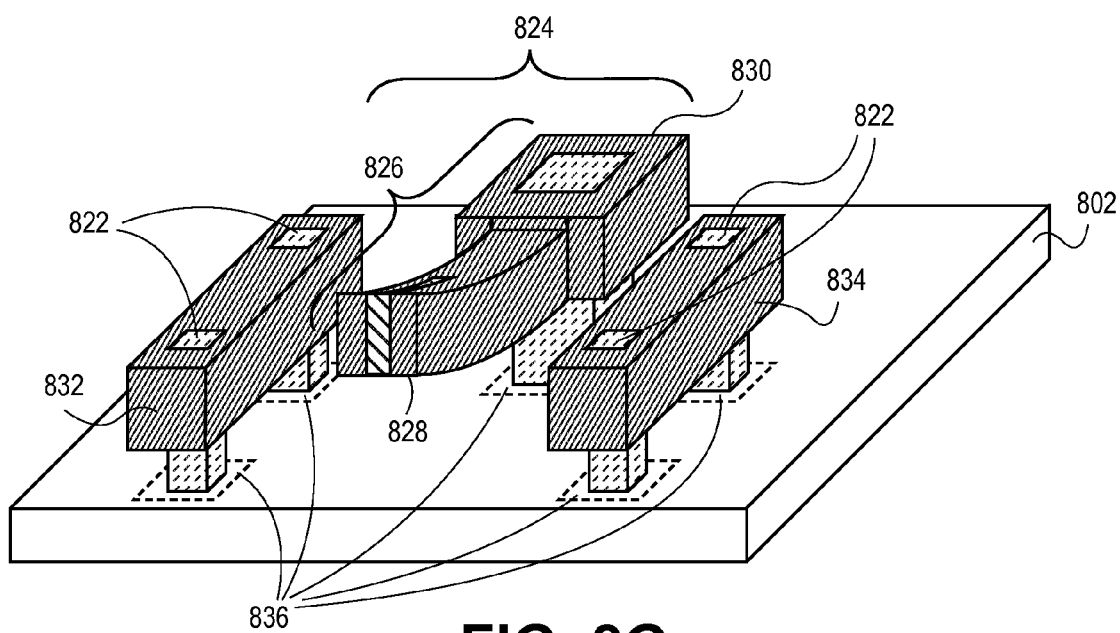
FIG. 8G depicts an isometric view of the resonator fabricated by the method depicted in FIGS. 8A-8F after the resonator is released.

In FIG. 8G, patterned release layer 820 may be removed to release the resonator 826. MEMS device 824 then includes a resonator 826 having a tip 828 and a base 830. Resonator 826 is coupled with substrate 802 by a coupler 822. Upon releasing the patterned structural layer 816 to form the resonator 826, the residual film stress gradient in the patterned structural layer 816 deflects a first portion, tip 828, out of a plane of the electrode. A pair of electrodes 832 and 834 are also coupled with substrate 802 by couplers 822. In accordance with one embodiment of the present invention, couplers 822 are connected with electrical contacts 836 housed in substrate 802, as depicted in FIG. 8G. Patterned release layer 820 may be removed by any technique known in the art for the particular material selected. For example, in accordance with one embodiment, substrate 802 includes a top insulator layer, patterned structural layer 816 is a silicon/germanium alloy, while release layer 804 is germanium.

It is to be understood that the above description is intended to be illustrative, and not restrictive. Many other embodiments will be apparent to those of skill in the art upon reading and understanding the above description. Although the present invention has been described with reference to particularly graceful embodiments, it will be recognized that the invention is not limited to the embodiments described, but can be practiced with modification and alteration within the spirit and scope of the appended claims. Accordingly, the specification and drawings are to be regarded in an illustrative sense rather than a restrictive sense. The scope of the invention should, therefore, be determined with reference to the appended claims, along with the full scope of equivalents to which such claims are entitled.

What is claimed is:

1. A method of forming a microelectromechanical systems (MEMS) device, the method comprising:
   forming an electrode on a substrate;
   forming a structural layer on the substrate, the structural layer disposed about a perimeter of the electrode and having a thickness and a residual film stress gradient; and
   releasing the structural layer to form a resonator coupled to the substrate, the residual film stress gradient deflecting a first portion of the resonator out of a plane defined by a surface of the electrode,
   wherein the resonator comprises a cantilever beam and a first plurality of lattice beams extending along a length of the cantilever beam.

2. The method as in claim 1, wherein forming the structural layer comprises depositing, over the substrate, a film including a dopant gradient over the film thickness, or depositing, over the substrate, a film stack comprising a plurality of films, each film with an intrinsic residual stress to form a residual film stress gradient over the thickness of the structural layer.

3. The method as in claim 1, further comprising:
   frequency trimming the resonator by selectively modifying the thickness of the structural layer.

4. The method as in claim 3, wherein selectively modifying the thickness further comprises at least one of: localized polishing of the structural layer prior to releasing the structural layer or focused ion beam etching of the structural layer either before or after releasing the structural layer.

5. The method as in claim 1, wherein the resonator has a thickness-to-width ratio less than one.

6. The method as in claim 1, wherein the resonator comprises a first material with a first coefficient of thermal expansion, and a second material with a second coefficient of thermal expansion.

7. The method as in claim 1, wherein the resonator comprises a first material with a first Young's modulus dependence on temperature, and a second material with a second Young's modulus dependence on temperature.

8. The method as in claim 7, wherein the first material has a negative Young's modulus dependence on temperature and the second material has a positive Young's modulus dependence on temperature.

9. The method as in claim 7, wherein the first material is a semiconductor and the second material is a dielectric.

10. The method as in claim 9, wherein the semiconductor comprises at least one of silicon and germanium and the dielectric comprises silicon dioxide.

11. The method as in claim 7, wherein the second material is contained within a trench in the first material.

12. The method as in claim 7, wherein the substrate includes an insulator layer above a plurality of interconnect structures coupled to a plurality of microelectronic devices and the MEMS device is formed above the insulator layer.

13. The method as in claim 1, further comprising:
   forming a second electrode above a tuning plate.

14. The method as in claim 1, wherein a surface along a length of the resonator is spaced apart from a surface of the electrode to form a gap that is to remain substantially constant when the resonator is driven.

15. A method of forming a microelectromechanical systems (MEMS) device, the method comprising:
   forming an electrode on a substrate;
   forming a structural layer on the substrate, the structural layer disposed about a perimeter of the electrode and having a residual film stress gradient; and
   releasing the structural layer to form a resonator coupled to the substrate, the residual film stress gradient deflecting a first portion of the resonator out of a plane defined by a surface of the electrode,
   wherein forming the structural layer further comprises at least one of laser recrystallization or metal-induced crystallization to vary the crystallinity over the thickness of the structural layer.

16. The method as in claim 15, wherein the resonator comprises a cantilever beam and a first plurality of lattice beams extending along a length of the cantilever beam.

17. The method as in claim 15, wherein the resonator comprises a central beam and a lattice portion positioned at a first end of the central beam, the lattice portion forming a perimeter around the electrode.

18. A method of forming a microelectromechanical systems (MEMS) device, the method comprising:
- forming an electrode on a substrate;
- forming a structural layer on the substrate, the structural layer disposed about a perimeter of the electrode and having a residual film stress gradient;
- releasing the structural layer to form a resonator coupled to the substrate, the residual film stress gradient deflecting a first portion of the resonator out of a plane defined by a surface of the electrode; and
- forming a tuning plate above a second electrode.

19. The method as in claim 18, wherein the second electrode is embedded in the substrate below the plane defined by the surface of the electrode.

20. The method as in claim 18, wherein the tuning plate is configured to adjust a resonant frequency of the resonator in response to a voltage difference between the resonator and the second electrode.

* * * * *